United States Patent
Park et al.

(10) Patent No.: US 8,674,844 B2
(45) Date of Patent: Mar. 18, 2014

(54) DETECTING PLASMA CHAMBER MALFUNCTION

(75) Inventors: Beom Soo Park, San Jose, CA (US);
Hong Soon Kim, San Jose, CA (US);
Soo Young Choi, Fremont, CA (US);
James Hoffman, San Jose, CA (US);
Suhail Anwar, San Jose, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 930 days.

(21) Appl. No.: 12/661,699

(22) Filed: Mar. 19, 2010

(65) Prior Publication Data

US 2010/0245084 A1 Sep. 30, 2010

Related U.S. Application Data

(60) Provisional application No. 61/161,658, filed on Mar. 19, 2009.

(51) Int. Cl.
*G08B 21/00* (2006.01)

(52) U.S. Cl.
USPC .................... 340/658; 340/540; 340/679

(58) Field of Classification Search
None
See application file for complete search history.

(56) References Cited

U.S. PATENT DOCUMENTS

| | | | |
|---|---|---|---|
| 3,020,529 A | 2/1962 | Turner | |
| 3,519,927 A | 7/1970 | Holt | |
| 4,588,952 A | 5/1986 | Matsuoka | |
| 5,543,689 A | 8/1996 | Ohta et al. | |
| 5,643,364 A | 7/1997 | Zhao et al. | |
| 5,654,679 A | 8/1997 | Mavretic et al. | |
| 5,810,963 A | 9/1998 | Tomioka | |
| 6,124,758 A | 9/2000 | Korte et al. | |
| 6,528,949 B2 | 3/2003 | Hao | |
| 6,677,711 B2 | 1/2004 | MacGearailt | |
| 6,703,080 B2 | 3/2004 | Reyzelman et al. | |
| 6,718,272 B1 | 4/2004 | Fisk et al. | |
| 6,799,532 B2 | 10/2004 | Sirkis et al. | |
| 6,815,362 B1 * | 11/2004 | Wong et al. | 438/706 |
| 6,954,077 B2 | 10/2005 | Strang | |
| 7,013,834 B2 * | 3/2006 | Tyler et al. | 118/723 E |
| 7,292,045 B2 | 11/2007 | Anwar et al. | |
| 7,514,936 B2 | 4/2009 | Anwar et al. | |
| 7,902,991 B2 | 3/2011 | Park et al. | |
| 8,174,400 B2 | 5/2012 | Park et al. | |
| 8,271,103 B2 * | 9/2012 | Hendler et al. | 700/31 |
| 2003/0063420 A1 | 4/2003 | Pahl et al. | |
| 2003/0097984 A1 | 5/2003 | Nakano et al. | |
| 2004/0097089 A1 | 5/2004 | Ohmi et al. | |
| 2004/0259276 A1 * | 12/2004 | Yue et al. | 438/5 |
| 2005/0119864 A1 | 6/2005 | Coumou et al. | |
| 2006/0032584 A1 | 2/2006 | Itabashi et al. | |
| 2006/0252283 A1 | 11/2006 | Takeda et al. | |
| 2006/0259259 A1 | 11/2006 | Rozenboim et al. | |
| 2008/0074255 A1 | 3/2008 | Park et al. | |

* cited by examiner

*Primary Examiner* — Mohammad Ghayour
*Assistant Examiner* — Brian Wilson
(74) *Attorney, Agent, or Firm* — Robert J. Stern (57) ABSTRACT

Malfunction of a component within an RF-powered plasma chamber is detected by observing an operating condition of the plasma chamber and detecting when the operating condition deviates from a previously observed range bounded by lower and upper limits. The lower and upper limits are determined by observing the minimum and maximum values of that operating condition during the processing of workpieces throughout one or more plasma chamber cleaning cycles immediately preceding the most recent cleaning of the plasma chamber.

15 Claims, 6 Drawing Sheets

DETECTING PLASMA CHAMBER MALFUNCTION

CROSS REFERENCE TO RELATED APPLICATION

The invention claims priority of U.S. provisional patent application No. 61/161,658 filed Mar. 19, 2009 by Beom Soo Park.

FIELD OF THE INVENTION

The invention relates generally to apparatus and methods for detecting malfunction of a component within a plasma chamber, especially a plasma chamber for fabricating an electronic workpiece such as a semiconductor circuit, an electronic display, a solar cell, or a solid state light emitting device. More specifically, the invention relates to detecting such malfunction by comparing an operating condition of the plasma chamber such as the frequency of the RF power supply with lower and upper limits.

BACKGROUND OF THE INVENTION

Electronic devices such as semiconductor integrated circuits, electronic flat panel displays, solar cells, or solid state light emitting devices generally are manufactured by performing a sequence of process steps in various plasma chambers. Such process steps commonly include steps performed within plasma chambers, such as an etch step performed in a plasma etch chamber or a deposition step performed in a plasma-enhanced chemical vapor deposition chamber or a plasma sputtering chamber. Any chamber for performing a step in the manufacture of an electronic device while a plasma exists within the chamber is considered a plasma chamber.

Malfunctions occasionally occur to components within a plasma chamber. If a plasma process is not halted after a malfunction occurs, there is a risk of producing more serious damage to the chamber components or the workpiece. Therefore, it is important to detect such malfunctions as quickly as possible so that the plasma process can be halted.

One common malfunction is broken ground straps attached to the susceptor that holds the workpiece. In many plasma chambers, the susceptor is moved to a lower position when a workpiece is moved into or out of the chamber and is moved to an upper position while plasma process are being performed on the workpiece. The up and down movement of the susceptor flexes and eventually breaks some of the ground straps attached to the susceptor.

Another common malfunction is cracking or breakage of the workpiece itself. Such damage to the workpiece is most likely to occur at the start of a plasma process because the workpiece is subjected to rapid changes in temperature and voltage at that time.

US patent application publication no. 2008-0074255 A1, having the same assignee as the present application, discloses an apparatus capable of detecting such malfunctions when RF power is supplied to the plasma chamber by a variable-frequency RF power supply whose frequency is adjusted to optimize the impedance match between its output and the load, so that the frequency of the RF power supply changes in response to changes in the load impedance presented by the plasma chamber. In that design, upon a change in the state of the workpiece processing, such as when plasma processing of a new workpiece begins, the RF power supply frequency is compared with lower and upper frequency limits. A malfunction is detected if the RF power supply frequency moves outside the "normal" frequency range bounded by the lower and upper frequency limits. There is no disclosure of adaptively updating the frequency limits as a function of the power supply frequency range actually experienced during processing of the previous workpiece.

SUMMARY OF THE INVENTION

The invention is an apparatus and method for detecting malfunction of a component within an RF-powered plasma chamber by observing an operating condition of the plasma chamber. The invention detects a malfunction when the operating condition deviates from a previously observed range bounded by lower and upper limits.

A novel and advantageous feature of the present invention is that it automatically adjusts the lower and upper limits against which an operating condition of the plasma chamber is compared to detect a malfunction. Specifically, the minimum and maximum values of that operating condition are observed (i.e., measured or ascertained) during the processing of workpieces throughout one or more plasma chamber cleaning cycles immediately preceding the most recent cleaning of the plasma chamber. Then, the lower limit for that operating condition is established as the minimum observed value during said number of immediately preceding cleaning cycles minus a first offset value. Likewise, the upper limit for that operating condition is established as the maximum observed value during said number of immediately preceding cleaning cycles plus a second offset value.

A cleaning cycle is defined as the period during which a number of successive workpieces are processed between one cleaning of the plasma chamber and the next cleaning of the plasma chamber. Preferably, said number of immediately preceding cleaning cycles is one. That is, the lower and upper limits defined in the preceding paragraph preferably are determined after each cleaning cycle based on the observed minimum and maximum values of the operating condition during the cleaning cycle that just ended.

The first and second offset values can be predetermined fixed values, or they can be established as a function of the minimum and maximum observed values or other statistics of the operating condition.

The comparison is performed each time plasma processing of a new workpiece begins.

Optionally, the comparison also is performed each time the supply of RF power to the chamber turns on after having been turned off.

Optionally, the comparison also is performed each time a new fabrication process step begins. A new fabrication process step may be characterized, for example, by a change in reagents supplied to the plasma chamber or a change in operating conditions of the plasma chamber such as a change in the reagents supplied to the plasma chamber, reagent flow rate, chamber pressure, workpiece temperature, or RF power.

There is no need to perform the comparison continuously or periodically during plasma processing of a workpiece. The malfunctions detected by the invention—such as breakage of ground straps, damaged chamber components, or a damaged workpiece—are mostly likely to occur in response to an abrupt change in RF power or chamber operating conditions as typically occurs at the beginning of a plasma process or process step.

The operating condition that is compared with the lower and upper limits to detect a malfunction can be any operating condition of the plasma chamber.

More preferably, the observed operating condition is an operating condition whose value changes in response to a change in one or more physical properties of the plasma within the plasma chamber. One example of a such an operating condition is the frequency of a variable-frequency RF power supply whose frequency is adjusted to optimize the impedance match between its output and the load, such that the frequency of the RF power supply changes in response to changes in the load impedance presented by the plasma chamber. Additional examples of such an operating condition are: a control signal that controls the value of a reactance in an impedance matching network; the DC bias voltage on an electrode of the plasma chamber; or the magnitude of RF voltage on an electrode of the plasma chamber.

Another method aspect of the invention comprises repeatedly performing the steps of: (1) plasma processing a set of one or more workpieces within the plasma chamber; (2) a controller observing the minimum value and the maximum value of a first operating condition of the plasma chamber during the plasma processing of said set; (3) the controller establishing the value of a first lower limit as equal to said minimum value of the first operating condition minus a first non-negative offset value, and establishing the value of a first upper limit as equal to said maximum value of the first operating condition plus a second non-negative offset value; (4) after the step of plasma processing said set, cleaning one or more components of the plasma chamber; (5) subsequently plasma processing a subsequent set of one or more workpieces within the plasma chamber; and (6) for each respective workpiece in said subsequent set, the controller performing the steps of: (i) after plasma processing of that respective workpiece begins, observing the present value of said first operating condition of the plasma chamber; (ii) comparing said present value of the first operating condition to the values established in the establishing step for the first lower limit and the first upper limit; and (iii) signaling an alert if said present value of the first operating condition is less than the first lower limit or greater than the first upper limit.

Another method aspect of the invention comprises repeatedly performing the steps of: (1) performing first and second plasma processes on each successive workpiece in a set of one or more workpieces; (2) a controller observing the minimum value and the maximum value of a first operating condition of the plasma chamber during said performing of the first plasma process on the workpieces of said set; (3) the controller establishing the value of a first lower limit as equal to said minimum value minus a first non-negative offset value, and establishing the value of a first upper limit as equal to said maximum value plus a second non-negative offset value; (4) after performing said first and second plasma processes on each successive workpiece in said set, cleaning one or more components of the plasma chamber; (5) subsequently performing said first and second plasma processes on a subsequent set of one or more workpieces within the plasma chamber; and (6) for each respective workpiece in said subsequent set, the controller performing the steps of: (i) after the performing of the first plasma process on that respective workpiece begins, observing the present value of said first operating condition of the plasma chamber; (ii) comparing said present value to the values established in the establishing step for the lower limit and upper limit; and (iii) signaling an alert if said present value is less than the lower limit or greater than the upper limit.

Another apparatus aspect of the invention comprises a limit controller that includes a comparator and a memory circuit, wherein: (1) during plasma processing within the plasma chamber of a first set of one or more workpieces, the limit controller observes the minimum value and the maximum value of an operating condition of the plasma chamber; (2) the limit controller stores in the memory circuit the value of a lower limit equal to said minimum value minus a first non-negative offset value; (3) the limit controller stores in the memory circuit the value of an upper limit equal to said maximum value plus a second non-negative offset value; (4) during plasma processing within the plasma chamber of a subsequent set of one or more workpieces, the limit controller observes the present value of said operating condition of the plasma chamber after plasma processing begins for each workpiece of the subsequent set; (5) during the plasma processing within the plasma chamber of a subsequent set of one or more workpieces, for each respective workpiece in said subsequent set: (i) after plasma processing of that respective workpiece begins, the limit controller observes the present value of said operating condition of the plasma chamber, (ii) the comparator compares said present value to the values stored in the memory circuit for the lower limit and upper limit, and (iii) the limit controller signals an alert if said present value is less than the lower limit or greater than the upper limit; (6) said plasma processing of said subsequent set of one or more workpieces is subsequent to a cleaning of one or more components of the plasma chamber; and (7) said cleaning is subsequent to said plasma processing of said first set of one or more workpieces.

DETAILED DESCRIPTION OF THE PREFERRED EMBODIMENTS

1. Overview of Plasma Chamber and RF Power Supply

Figure 1:
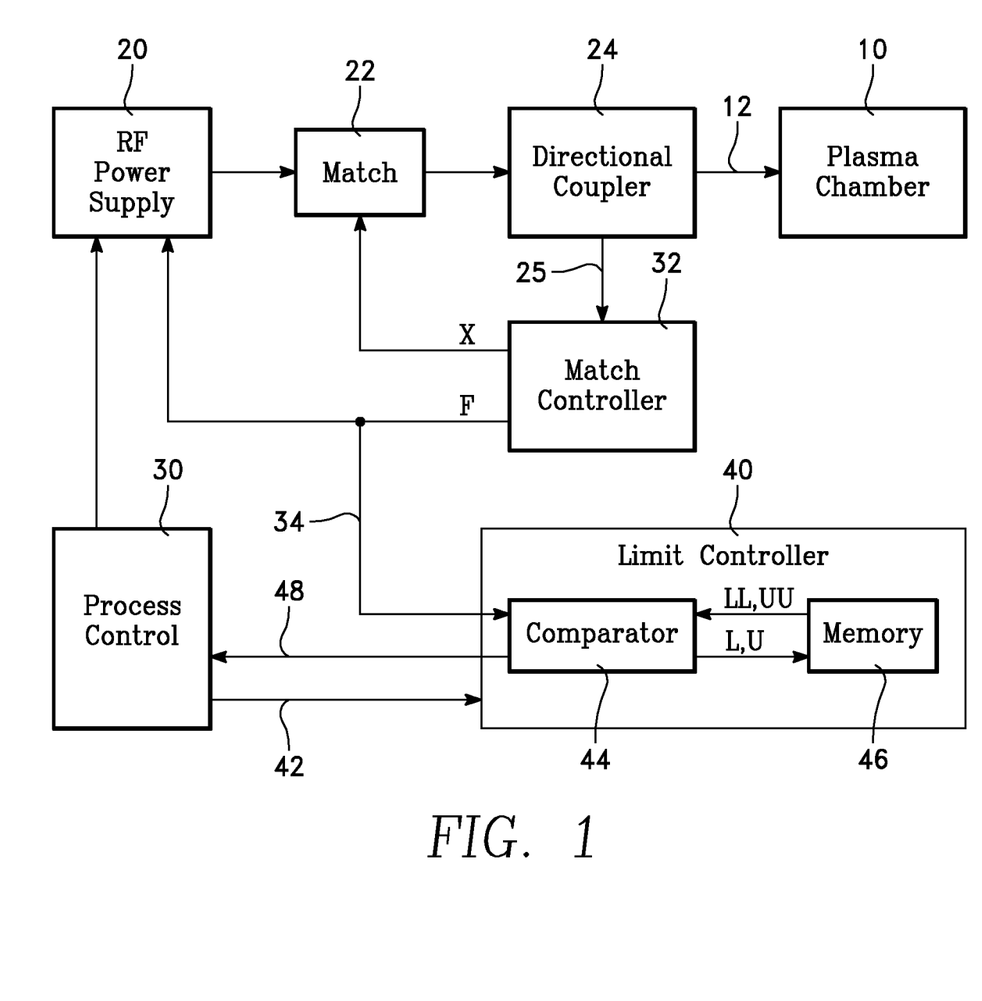
FIG. 1 is a block diagram of an apparatus according to the invention for detecting a malfunction in a plasma chamber.

FIG. 1 is a block diagram showing an electrical circuit according to the present invention for detecting malfunction of a component within an RF-powered plasma chamber. The electrical circuit of the invention is connected to a conventional plasma chamber 10 for performing one or more fabrication processes used in fabricating an electronic device on a workpiece within the plasma chamber. For example, the plasma chamber can be a plasma-enhanced chemical vapor deposition chamber, a sputtering chamber, or a plasma etch chamber. Examples of an electronic device fabricated on the workpiece include a semiconductor circuit, an electronic display, a solar cell, or a solid state light emitting device.

Describing first the conventional components shown in FIG. 1, the plasma chamber has an RF input 12 that is connected to receive RF power from the output of a conventional RF power supply 20 so that the RF power contributes to sustaining a plasma within the plasma chamber. The RF input may include, for example, an electrode that capacitively couples the RF power to the plasma or an induction coil that inductively couples the RF power to the plasma. An RF-powered showerhead or diffusor for dispensing reagent gas into the plasma chamber is commonly used as a capacitively coupled electrode.

An impedance matching network 22 and directional coupler 24 are connected between the RF power supply and the plasma chamber. If the impedance matching network is located closer to the RF power supply than the plasma chamber as in the illustrated embodiment, the directional coupler typically is connected between the impedance matching network and the RF input of the plasma chamber. Conversely, if the impedance matching network is located closer to the plasma chamber than the RF power supply, the directional coupler typically is located between the RF power supply and the impedance matching network. The directional coupler outputs an electrical measurement signal 25 that indicates a measure of the reflected RF power between the directional coupler and the impedance matching network. Examples of the measure of reflected RF power include the magnitude of reflected power, the ratio of reflected power to forward power (known as "standing wave ratio" or SWR), or the square root of such ratio (known as "reflected power coefficient", "voltage standing wave ratio" or VSWR).

A conventional plasma chamber typically includes a process controller 30 and a match controller 32. Each controller 30, 32 can be implemented as as conventional controller circuit, typically a programmable computer processor. Optionally, a single computer processor can be programmed to function as both the process controller 30 and the match controller 32.

The process controller 30 conventionally implements the sequence of steps, referred to as process steps, required to perform the fabrication processes to be performed on the workpiece within the plasma chamber. For example, the process controller sends various control signals to robots that transfer the workpiece, to gas valves that regulate the flow of process gases into the chamber, and to the RF power supply 20 to control the level of RF power.

The match controller 32 receives the measurement signal 25 from the directional coupler and controls the impedance matching network 22, the RF power supply 20, or both in order to minimize the reflected RF power. If the impedance matching network includes one or more adjustable reactances, the match controller sends a control signal X to the impedance matching network whose value controls the values of the adjustable reactances. In other words, the impedance matching network adjusts the values of its adjustable reactances in response to the value of the control signal X that the impedance matching network receives from the match controller. Consequently, the value of the control signal X represents the respective values of the adjustable reactances within the impedance matching network.

If the impedance matching network 22 includes only fixed reactances, or optionally even if it includes adjustable reactances, the match controller 32 sends a control signal F to the RF power supply 20 whose value controls the frequency of the RF power produced by the RF power supply. In other words, the RF power supply adjusts the frequency of the RF power produced at the output of the RF power supply in response to the control signal F that the RF power supply receives from the match controller. Consequently, the value of the control signal F represents the frequency of the RF power produced at the output of the RF power supply.

The match controller 32 adjusts the value of either or both of the control signals X and F so as to minimize the measure of reflected RF power indicated by measurement signal 25 outputted by the directional coupler 24. The resultant values of the control signals X and F are a function of the load impedance presented to the impedance matching network 22 by the RF input 12 of the plasma chamber. This load impedance varies as a function of the characteristics of the plasma within the plasma chamber and the integrity of the RF connections to the plasma chamber.

2. Overview of Detecting Malfunction in Plasma Chamber

As stated in the Background of the Invention, a malfunction sometimes occurs while a workpiece is undergoing processing within the plasma chamber. Such malfunction can be a component of the plasma chamber that is damaged or requires routine maintenance, or the malfunction can be a damaged workpiece such as a cracked glass substrate. If a plasma process is not halted after a serious malfunction occurs, there is a risk of producing more serious damage to the plasma chamber or the workpiece. Therefore, it is important to detect a malfunction within the plasma chamber as quickly as possible so that the plasma process can be halted.

The invention includes a limit controller 40 that detects a malfunction within the plasma chamber by observing an operating condition 34 of the plasma chamber. The limit controller produces an alert signal if the value of the observed operating condition 34 is less than a lower limit LL or greater than an upper limit UU. The limit controller can be implemented as as conventional controller circuit, typically a programmable computer processor. Optionally, a single computer processor can be programmed to function as the limit controller 40 as well as either or both of the process controller 30 and the match controller 32.

The control signals X and F produced by the match controller 32 are examples of operating conditions 34 of the plasma chamber that can be observed by the limit controller 40 to detect a malfunction. Any malfunction that changes the characteristics of the plasma within the plasma chamber or the integrity of the RF connections to the plasma chamber is likely to substantially change the load impedance presented to the impedance matching network 22 by the RF input 12 of the plasma chamber, and thereby change the values of the control signals X and F. For example, breakage of the ground straps attached to the susceptor that holds the workpiece, and cracking or breakage of the workpiece itself, are examples of malfunctions that would change the load impedance and hence produce changes in the values of the control signals X and F.

As stated above, the match controller 32 commonly produces only one of the two control signals X or F. In such cases the limit controller of our invention would observe only that one control signal as the observed operating condition 34.

More generally, the operating condition 34 that is compared with the lower and upper limits to detect a malfunction can be any operating condition of the plasma chamber whose value changes in response to a change in one or more physical properties of the plasma within the plasma chamber. Besides the control signals X and F described above, additional examples of a suitable operating condition whose value can be observed by the limit controller 40 to detect a malfunction include the DC bias voltage on an electrode of the plasma chamber; the magnitude of RF voltage on an electrode of the plasma chamber; temperature of the workpiece, the susceptor or any other component of the plasma chamber; process gas flow rates; or throttle valve angle of the chamber exhaust pump. In the context of the present invention, the susceptor that holds the workpiece is considered an electrode of the plasma chamber.

The embodiment described throughout the remainder of this patent description has as its observed operating condition 34 the control signal F whose value represents the RF power supply frequency. Accordingly, the operating condition 34 is denoted by the symbol F in the flowcharts of FIGS. 5 and 6. However, the symbol F should be interpreted to mean any other operating condition 34 that can be observed to detect a malfunction of the plasma chamber as described in the three preceding paragraphs.

Figure 2:
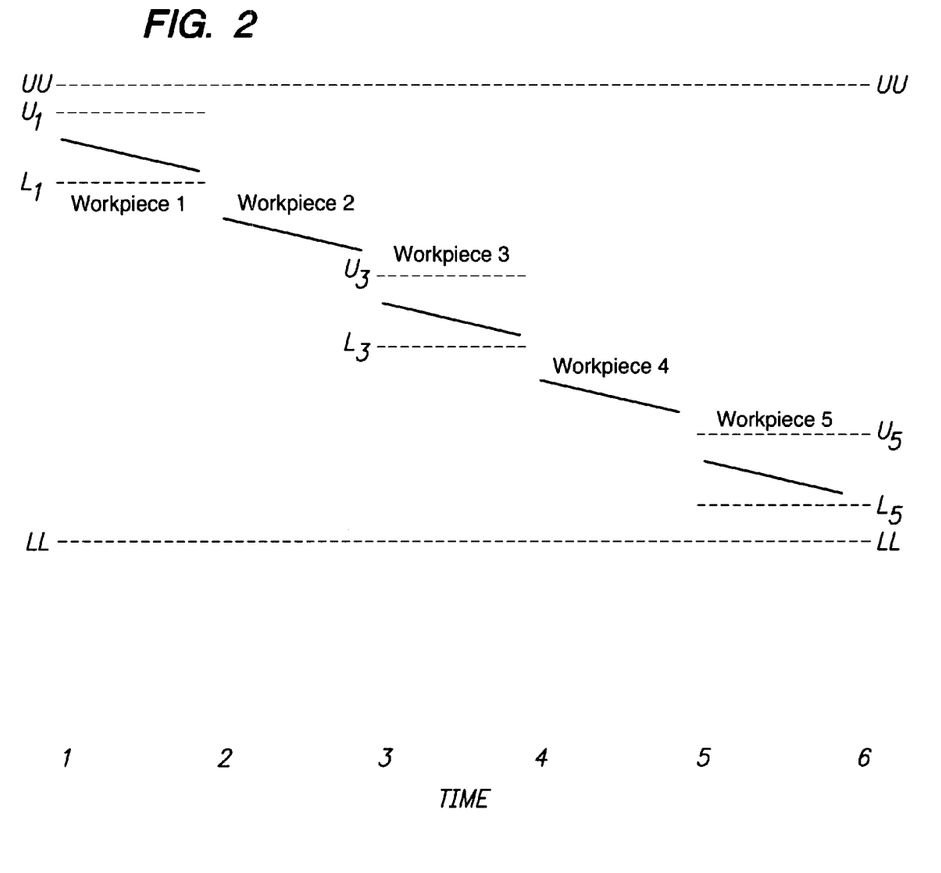
FIG. 2 is a graph showing the frequency of the RF power supply as a function of time during one cleaning cycle in which five workpieces are processed sequentially.
Figure 3:
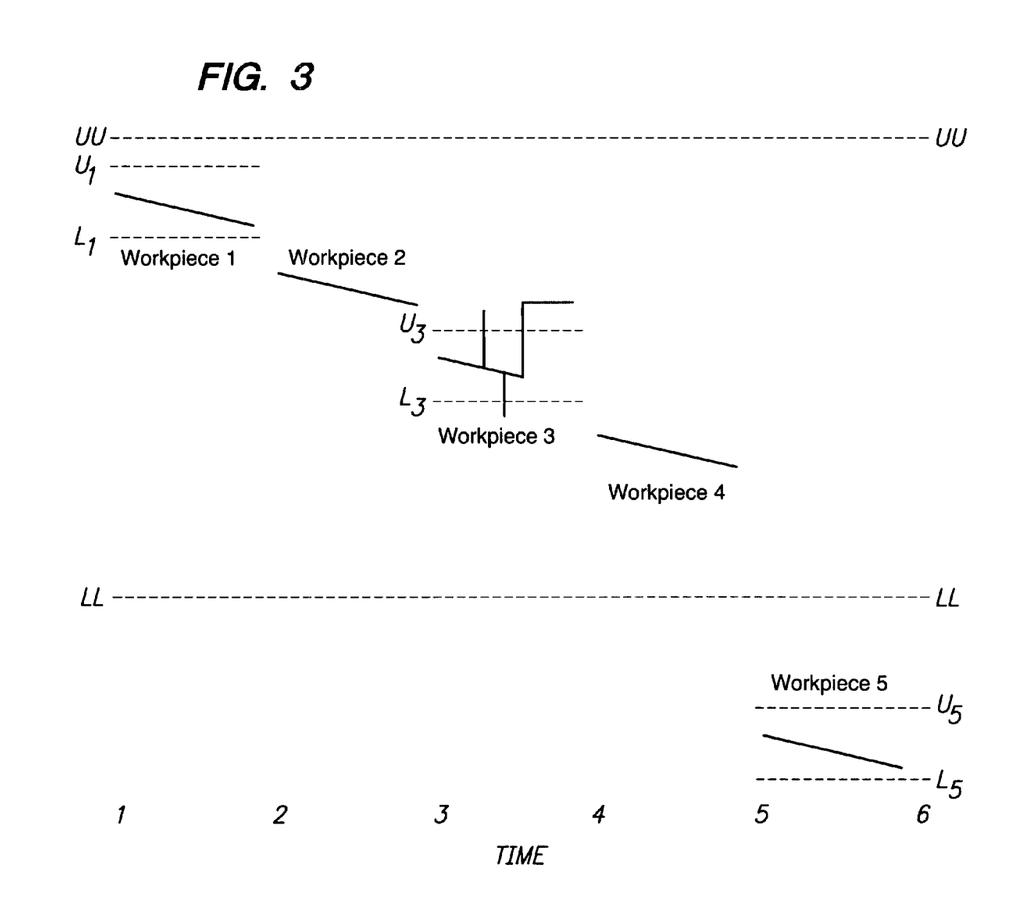
FIG. 3 is a graph like that of FIG. 2, but illustrating abnormal conditions during plasma processing of the third and fifth workpieces.

FIGS. 2 and 3 illustrate how the RF power supply frequency, controlled by control signal F, typically would change in the course of performing the same plasma process during one cleaning cycle in which five workpieces are processed sequentially. FIGS. 2 and 3 are hypothetical, not actual test data. The exemplary plasma chamber has an impedance matching network 22 with fixed reactances, so the match controller 32 minimizes the reflected power in response to changes in the load impedance by adjusting the control signal F to adjust the frequency of the RF power supply.

In FIGS. 2 and 3 the vertical axis represents the frequency of the RF power supply and the horizontal axis represents time. The first workpiece is processed between time 1 and time 2, the second workpiece is processed between time 2 and time 3, etc., until the fifth workpiece is processed between time 5 and time 6.

The plasma process in the examples of FIGS. 2 and 3 is a plasma-enhanced chemical vapor deposition (PECVD) process in which a material is deposited on the workpiece. Because some reaction byproducts unavoidably are deposited on the chamber walls and other components of the plasma chamber, the accumulation of such deposits changes the characteristics of the plasma, and hence the load impedance at the RF input 12, between successive workpieces within a cleaning cycle. Therefore, FIG. 2 shows that the RF power supply frequency declines progressively from the first workpiece to the fifth workpiece. Importantly, for all five workpieces the RF power supply frequency nevertheless remains between lower limit LL and upper limit UU.

A cleaning cycle is defined as the period during which a number of successive workpieces are processed between one cleaning of the plasma chamber and the next cleaning of the plasma chamber. In the example shown in FIGS. 2 and 3, the number of workpieces processed in each cleaning cycle is five. In other words, the plasma chamber is cleaned after every five workpieces are processed. Because the chamber is cleaned before processing the sixth workpiece, the sixth workpiece will experience the same operating conditions as the first workpiece.

The RF power supply is turned off during the interval between the completion of the plasma process for one workpiece and the initiation of the plasma process for the next workpiece. During this interval the one workpiece just completed is transferred out of the plasma chamber and the next workpiece is transferred into the chamber. In FIGS. 2 and 3, the intervals during which the RF power supply is off are illustrated by discontinuities in the graph at time 2, time 3, time 4 and time 5.

FIG. 2 illustrates the variations in power supply frequency that can occur in a normally operating plasma chamber, without any malfunction.

FIG. 3 illustrates two types of hypothetical malfunctions, only the second of which is relevant to the present invention.

A "first type" of malfunction initiates some time after a plasma processing step begins and is not relevant to the present invention. As an example of the first type of malfunction, FIG. 3 illustrates the effects of unintended plasma arcing that begins during processing of the third workpiece, i.e., beginning some time after time 3. FIG. 3 shows that the RF power supply frequency changes because the arcing changes the plasma load impedance. However, the RF power supply frequency remains between the lower and upper limits LL and UU.

The present invention is not intended to detect this "first type" of malfunction. The "first type" of malfunction can be detected by the method depicted in FIG. 4 of the above-referenced US patent application publication no. 2008-0074255 A1, which is referred to in the "Background of the Invention" of the present patent specification as the first prior art method. The first prior art method detects a malfunction that occurs during the course of processing a given workpiece, or during the course of a given plasma process step, by comparing the power supply frequency at one or more times during such processing to a "baseline" power supply frequency that is observed at a point in time shortly after processing of that workpiece began.

A "second type" of malfunction occurs prior to, or upon the initiation of, a plasma processing step. As an example of the second type of malfunction, FIG. 3 illustrates a malfunction occurring at time 5 when processing of the fifth workpiece begins. The initiation of a plasma processing step can be either the initiation of processing of a new workpiece, or the initiation of any step in a series of plasma processing steps to be performed on a single workpiece.

The present invention detects the aforesaid "second type" of malfunction. Specifically, in the present invention the limit controller 40 detects when an operating condition 34 of the plasma chamber, such as the RF power supply frequency illustrated in FIG. 3, deviates from a "normal range" defined as the range bounded by a lower limit LL and an upper limit UU. Consequently, unlike the first prior art method mentioned in the second preceding paragraph, the present invention can detect when the value of the observed operating condition already has deviated outside its normal range when a plasma processing step begins.

For example, such deviation would exist at the time plasma processing of a workpiece begins if a malfunction occurred during the interval when one workpiece is being transferred out of the plasma chamber and the next workpiece is being transferred into the chamber. As another example, such deviation would exist at the time a plasma processing step begins if a malfunction occurred immediately upon the initiation of the plasma processing step as a result of the electrical and thermal stress when RF power is initiated.

A more specific example of the type of malfunction that can be detected by the present invention (the aforesaid "second type") is depicted at time 5 in FIG. 3, which illustrates a malfunction that causes the RF power supply frequency F to markedly decrease so as to drop below the lower limit LL when RF power is turned on at the beginning of the processing of the fifth workpiece at time 5. Such drop in frequency F could have been caused, for example, by the breakage of a number of susceptor ground straps when the susceptor that supports the workpiece was lowered and then raised during transfer of the fourth workpiece out of the plasma chamber followed by the transfer of the fifth workpiece into the chamber. Such broken ground straps are an example of damage to the integrity of the RF connections to the plasma chamber that would substantially change the load impedance at the RF input 12 of the plasma chamber.

Figure 5:
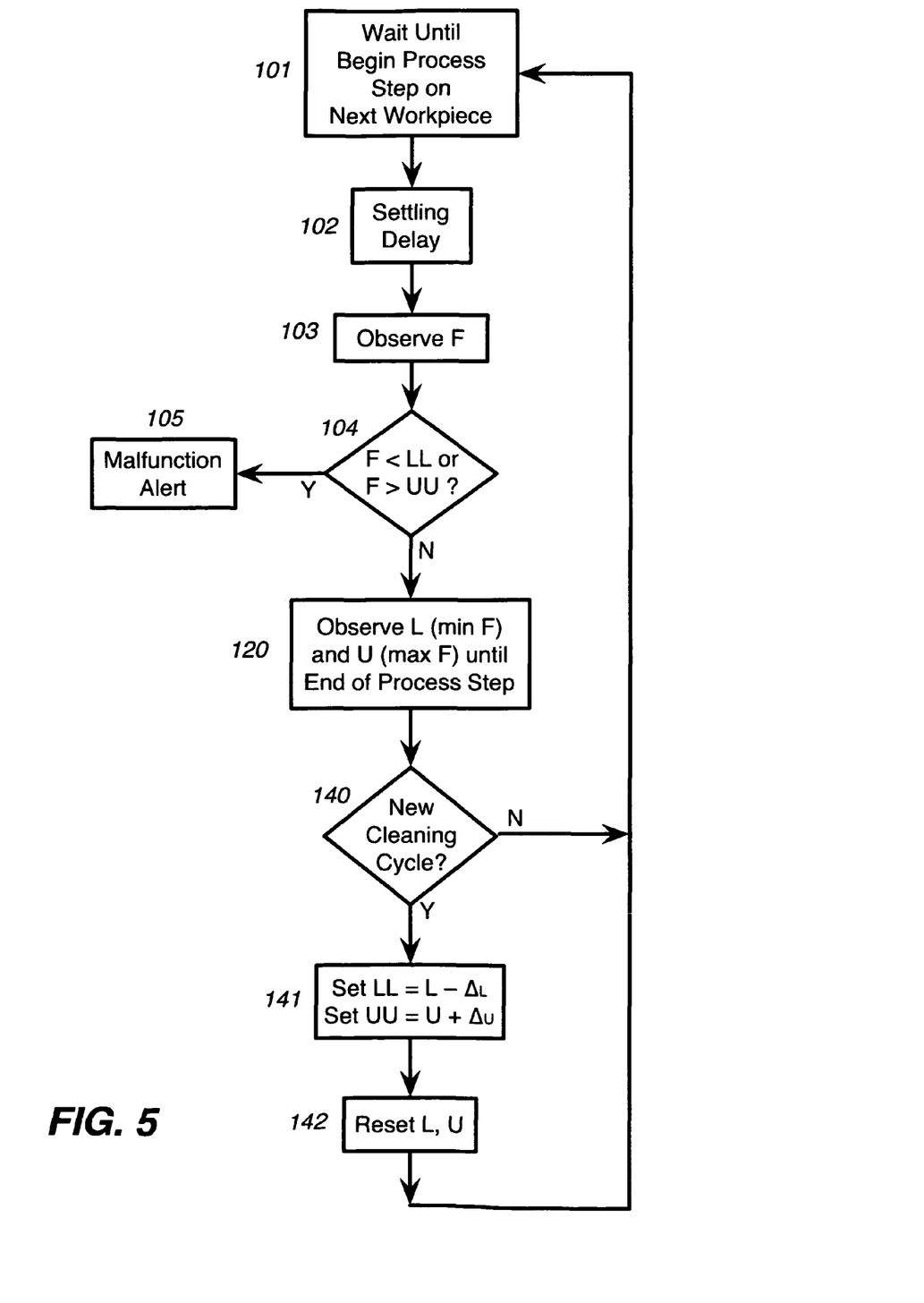
FIG. 5 is a flow chart of the method of the invention for establishing lower and upper limits and comparing an operating condition F of the plasma chamber with the lower and upper limits LL and UU.

This "second type" of malfunction can be detected by the present invention or by the method depicted in FIG. 5 of the above-referenced US patent application publication no. 2008-0074255 A1, which is referred to in the "Background of the Invention" of the present patent specification as the second prior art method. As explained below, an advantage of the present invention relative to the second prior art method is that the present invention automatically adapts to the range of values exhibited by the RF power supply frequency or other observed operating condition over the course of a cleaning cycle of the plasma chamber.

3. Apparatus and Method for Detecting Malfunction

Figure 4:
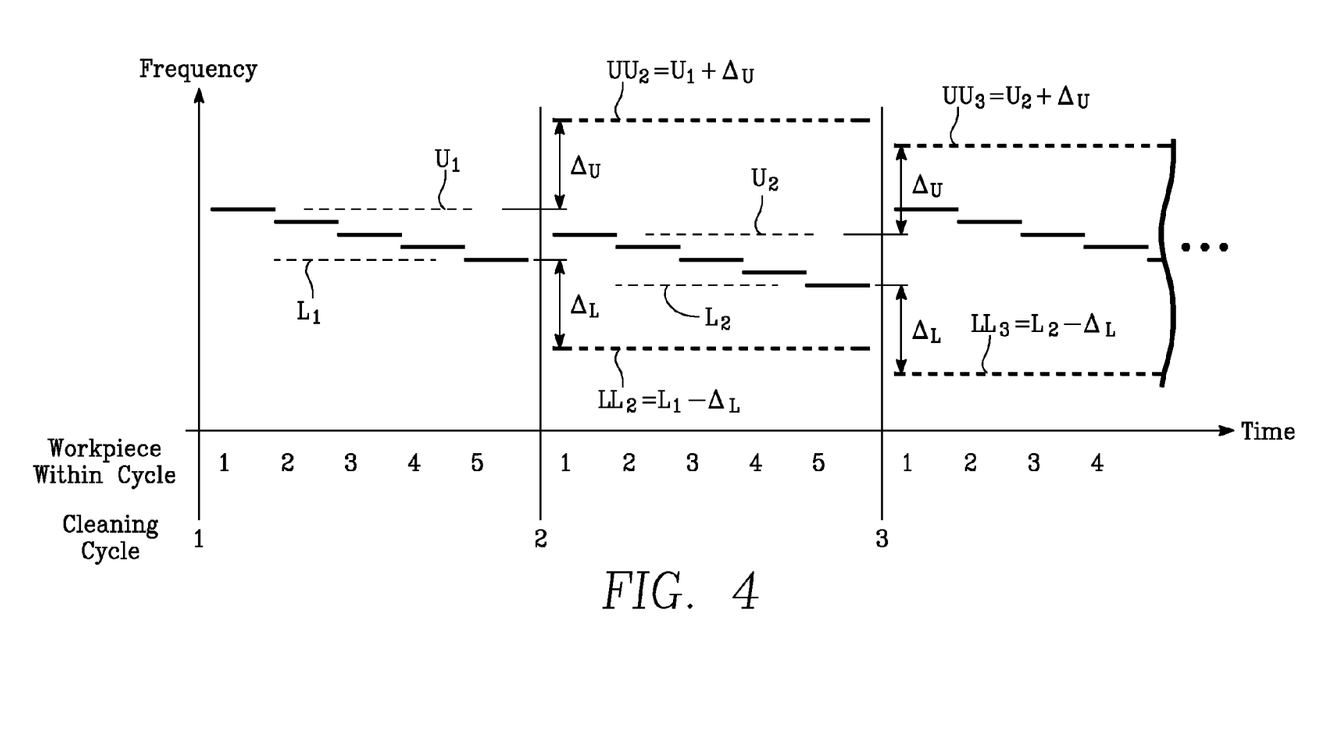
FIG. 4 is a graph showing the time-varying value of a observed operating condition relative to lower and upper limits determined according to the present invention.

FIG. 4 is a time line similar to FIG. 2 that is extended to show multiple cleaning cycles. The lower and upper limits LL and UU against which the operating condition 34 is compared to detect a malfunction preferably are updated between the end of one cleaning cycle and the beginning of next cleaning cycle based on the range of values of the operating condition 34 actually observed during the cleaning cycle that just ended. (The subsequent section "6. Lower and Upper Limits LL and UU Based on Multiple Cleaning Cycles" describes a more general embodiment in which the lower and upper limits LL and UU are based on the range of values of the operating condition 34 during a number of immediately preceding cleaning cycles, wherein said number can be one, two or more.)

As stated in the "Summary of the Invention", we define a "cleaning cycle" as the period during which a number of successive workpieces are processed between one cleaning of the plasma chamber and the next cleaning of the plasma chamber.

In FIG. 4 we use the notation $LL_i$ and $UU_i$ to denote the lower and upper limits used to detect a malfunction during the processing of workpieces within the i-th cleaning cycle: We use the notation $L_i$ and $U_i$ to denote the lower and upper bounds of the range of values actually exhibited by the operating condition 34 during the i-th cleaning cycle. When any of the symbols LL, UU, L or U is used herein without a subscript, it refers to the value of that parameter during the current cleaning cycle.

A detailed description of the apparatus and method for detecting malfunction according to the present invention is as follows.

Referring to the circuit diagram of FIG. 1, one of the steps performed by the conventional process controller 30 when processing of a new workpiece begins is to send a control signal 21 to the RF power supply 20 that commands it to turn on its supply of RF power to the RF input 12 of the plasma chamber.

The process controller 30 also conventionally outputs a process status signal 42 that indicates when processing of a new workpiece begins and ends. The process status signal also indicates when the plasma chamber has been cleaned, thereby indicating the beginning of a new cleaning cycle. Optionally, if the plasma chamber is used to perform a plurality of sequential process steps on a single workpiece, the process status signal also may indicate when a new process step begins and ends. The process status signal also may convey other information regarding the status of workpiece processing that is not relevant to the invention.

The limit controller 40 is connected to receive the process status signal 42 from the process controller 30. Referring to the flow chart of FIG. 5, the first step performed by the limit controller 40 (Step 101) is to wait until the process status signal 42 from the process controller 30 indicates that processing of the next workpiece has begun. If each workpiece undergoes a succession of process steps within the plasma chamber, the observed operating condition 34 may occur at the beginning of a specific process step other than the first process step. In such case, Step 101 includes waiting until such specific process step begins for the next workpiece. Embodiments of the invention in which each workpiece undergoes a succession of process steps within the plasma chamber are discussed in more detail in the subsequent section "7. Observing a Specific One of Multiple Process Steps for Each Workpiece".

After the onset of RF power at the beginning of a process step (Step 101), some time is required for the plasma conditions within the plasma chamber to stabilize and for the impedance matching network 22 and match controller 32 to stabilize. Therefore, after Step 101, the limit controller preferably waits for a predetermined time period (Step 102); referred to herein as the "settling delay", for the plasma conditions and the impedance matching network to stabilize as described above. Alternatively, if the process controller 30 delays setting the process status signal 42 to indicate the beginning of a new workpiece until after such stabilization has occurred, the settling delay step (Step 102) can be omitted by the limit controller.

In Step 104, a comparator circuit 44 within the limit controller 40 compares an operating condition 34 of the plasma chamber with lower and upper limits $LL_i$ and $UU_i$ that previously were stored (Step 141, described below) in the memory circuit 46. In the preferred embodiment shown in FIG. 1, the observed operating condition 34 is the frequency control signal F whose value represents the RF power supply frequency. The comparator circuit is connected to receive the lower limit $LL_i$ and the upper limit $UU_i$ from the memory circuit, and the comparator circuit is connected to receive the operating condition 34 (e.g., frequency control signal F) from the match controller 32.

If the comparator circuit 44 determines in Step 104 that the operating condition 34 being observed is less than the lower limit $LL_i$ or is greater than the upper limit $UU_i$, the limit controller 40 outputs an alert signal 48 to signify that it has detected a malfunction (Step 105).

Conversely, if the comparator circuit 44 determines in Step 104 that the operating condition 34 is between the lower limit $LL_i$ and the upper limit $UU_i$, the limit controller 40 infers that there is no malfunction. The limit controller then proceeds to Step 120.

Step 120 is performed throughout the remaining time the current workpiece undergoes the current process step in the plasma chamber. In other words, the limit controller 40 does not proceed from Step 120 to Step 140 until the performing of the current process step on the current workpiece is completed.

In Step 120, the limit controller observes the operating condition 34 for the purpose of establishing the lower and upper bounds $L_i$ and $U_i$ that eventually (Step 141) will be used to determine the lower and upper limits $LL_{i+1}$ and $UU_{i+1}$ for the next cleaning cycle (i.e., the (i+1)-th cleaning cycle). However, Step 120 does not alter the lower and upper limits $LL_i$ and $UU_i$ used in Step 104 for detecting a malfunction upon processing subsequent workpieces within the current cleaning cycle (i.e., the i-th cleaning cycle).

The limit controller moves from Step 120 to Step 140 when the performing of the current process step on the current workpiece is completed. In Step 140, the limit controller determines, typically from the process status signal 42, whether a chamber cleaning is to be performed after processing the current workpiece, i.e., whether a new cleaning cycle will begin with the next workpiece. If so, the limit controller performs Steps 141 and 142. Otherwise, the limit controller returns to Step 101 and waits for processing of the next workpiece to begin.

In Step 141, the limit controller sets the lower limit $LL_{i+1}$ and upper limit $UU_{i+1}$ to new values that will be used during the next cleaning cycle (the (i+1)-th cleaning cycle) as a function of the lower and upper bounds $L_i$ and $U_i$ of the operating condition 34 that were observed in Step 120 during the processing of the workpieces during the cleaning cycle that just completed (the i-th cleaning cycle). Step 141 is described in more detail in the subsequent sections entitled "5. Lower and Upper Limits LL and UU Based on One Preceding Cleaning Cycle" and "6. Lower and Upper Limits LL and UU Based on Multiple Cleaning Cycles".

In Step 142, the limit controller clears or resets the values of the lower and upper bounds $L_i$ and $U_i$ of the range that will be observed during the next cleaning cycle. In other words, the limit controller sets $L_i$ and $U_i$ to empty values or to initial, temporary values. The significance of Step 142 is described in the following section entitled "4. Observing Operating Condition Range L, U".

The limit controller preferably stores the values of each of the parameters $LL_i$, $L_i$ and $U_i$ in a conventional memory circuit 46 within the limit controller.

4. Observing Operating Condition Range L, U

In Step 120, the limit controller 40 determines the lowest value L and the highest value U exhibited by the operating condition 34 throughout the processing of all the workpieces processed in the course of one cleaning cycle. As described above, after the current cleaning cycle ends (Step 140), the limit controller uses the values of L and U that it determined from the cleaning cycle that just ended to set the values of the limits LL and UU (Step 141) that will be used in the next cleaning cycle to detect a malfunction (Step 104).

Figure 6:
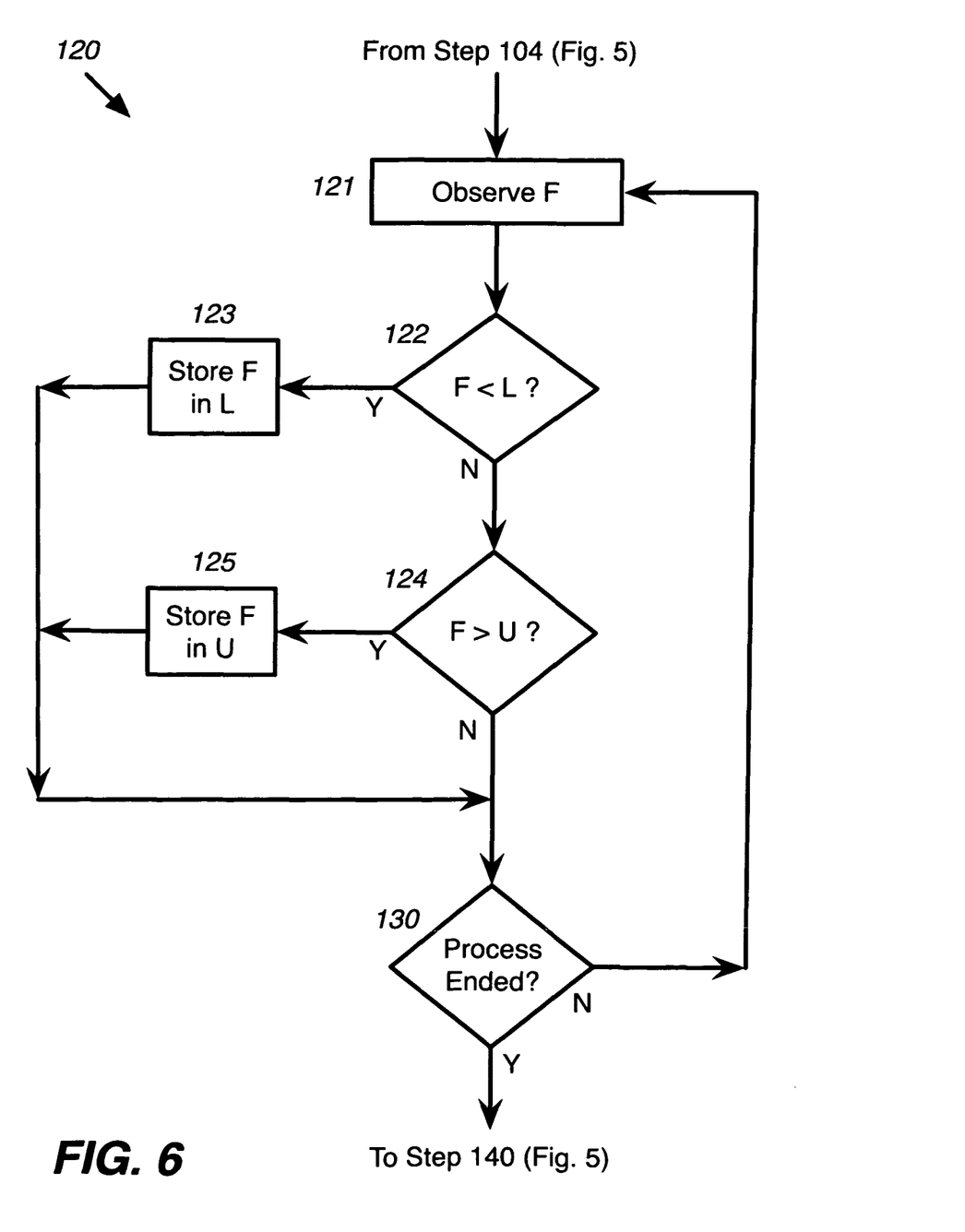
FIG. 6 is a flow chart of one implementation of Step 120 of FIG. 5.

One suitable implementation of Step 120 is illustrated in the flowchart of FIG. 6 as Steps 121-130. The limit controller periodically repeats the complete cycle of Steps 121-130 until the end of the process step currently being performed in the plasma chamber (Step 130).

The sequence of steps within Step 120 begins with Step 121, in which the limit controller 40 observes the current value of the operating condition 34. In other words, the limit controller receives the value of the operating condition 34 from a component of the plasma chamber that produces an electrical signal that represents the operating condition 34. In the embodiment illustrated in FIG. 1, the limit controller observes the current value of the operating condition 34 by receiving from the match controller 32 the frequency control signal F whose value controls the frequency of the RF output signal produced by the RF power supply 20.

In the subsequent Steps 122 and 124, the comparator circuit 44 in the limit controller compares the current value of the observed operating condition 34 (e.g., the RF power supply frequency F) with the values of $L_i$ and $U_i$ currently stored in the memory circuit 46. If the comparator circuit determines that the current value of the observed operating condition is less than the value of $L_i$ currently stored in the memory circuit (Step 122), the limit controller replaces the value of $L_i$ stored in the memory circuit with the current value of the observed operating condition 34 (Step 123). Likewise, if the comparator circuit determines that the current value of the observed operating condition is higher than the value of $U_1$ currently stored in the memory circuit (Step 124), the limit controller replaces the value of $U_i$ stored in the memory circuit is with the current value of the observed operating condition (Step 125). Consequently, the values of $L_i$ and $U_i$ stored in the memory circuit represent the lowest and highest values, respectively, of the observed operating condition 34 during the current cleaning cycle, i.e., the i-th cleaning cycle.

The steps of comparing the observed operating condition 34 with the values of $L_i$ and $U_i$ stored in the memory circuit (Steps 122 and 124) are performed by the limit controller one or more times during the processing of each successive workpiece during the current cleaning cycle. Preferably the limit controller repeats the complete cycle of Steps 121-130 periodically or continuously until the end of the process step currently being performed in the plasma chamber (Step 130). Consequently, if the value of the observed operating condition 34 fluctuates during the processing of any workpiece, the lowest, and highest values of such fluctuation will be observed and stored as the values of $L_i$ and $U_i$.

As stated above, between the end of one cleaning cycle and the beginning of the next cleaning cycle, in Step 142 (FIG. 5) the limit controller clears or resets the values of the lower and upper bounds $L_i$ and $U_i$ of the range that will be observed during the next cleaning cycle. In other words, the limit controller sets $L_i$ and $U_i$ to empty values or to initial, temporary values. Accordingly, the first time the limit controller performs Step 120 after $L_i$ and $U_i$ are cleared or reset, the results of the comparisons in Steps 122 and 124 should be "yes" so that Steps 123 and 125 are performed to initialize $L_i$ and $U_i$.

5. Lower and Upper Limits LL and UU Based on One Preceding Cleaning Cycle

Detecting a malfunction of the plasma chamber in accordance with the present invention relies on the values of the lower and upper limits LL and UU established by the limit controller 40. It was stated earlier that the limit controller establishes these values in Step 141 as a function of the observed bounds L and U of the observed operating condition 34. Step 141 now will be described in detail.

After a cleaning cycle ends (the (i−1)-th cleaning cycle) and before the next cleaning cycle begins (the i-th cleaning cycle), the limit controller already has performed Step 120 during the cleaning cycle that just ended. Consequently, the limit controller already has stored in the memory circuit 46 the lowest observed value $L_{i-1}$ and the highest observed value $U_{i-1}$ of the operating condition 34 during the processing of workpieces during the cleaning cycle that just ended, i.e., the (i−1)-th cleaning cycle.

As defined at the beginning of the section "3. Apparatus and Method for Detecting Malfunction", the symbols $LL_i$ and $UU_i$ denote the lower and upper limits employed by the limit controller to detect a malfunction (Step 104) during processing of the i-th workpiece. The symbols $L_{i-1}$ and $U_{1-1}$ denote the lowest value and highest value, respectively, of the observed operating condition 34 during processing of the (i−1)-th workpiece.

In Step 141, the limit controller 40 reads the values of $L_{i-1}$ and $U_{i-1}$ from the memory circuit 46 establishes the values of the lower and upper limits $LL_i$ and $UU_i$ as follows:

Consider first the simplest implementation of Step 141 in which the lower and upper limits LL and UU are based on the range of values observed for (i.e., exhibited by) the operating condition 34 during only the one immediately preceding cleaning cycle. In this implementation of Step 141, the limit controller sets the lower limit $LL_i$ to $L_{i-1}$ minus a first offset value which we denote $\Delta_L$. It sets the upper limit $UU_i$ to $U_{i-1}$ plus a second offset value which we denote $\Delta_U$.

The graph of FIG. 4 illustrates this implementation of Step 141. During the second cleaning cycle, the lower limit $LL_2$ equals the lowest value $L_1$ of the operating condition 34 (in this example, RF power supply frequency represented by control signal F) during the first cleaning cycle minus an offset $\Delta_L$. The upper limit $UU_2$ equals the highest value $U_1$ of the operating condition during the first cleaning cycle plus an offset $\Delta_U$. During the third cleaning cycle, the lower limit $LL_3$ equals the lowest value $L_2$ of the operating condition during the second cleaning cycle minus the offset $\Delta_L$. The upper limit $UU_3$ equals the highest value $U_2$ of the operating condition during the first cleaning cycle plus the offset $\Delta_U$.

FIG. 4 shows no lower and upper limits $LL_1$ and $UU_1$ for the first cleaning cycle because there is no previous cycle to provide values of L and U from which to determine $LL_1$ and $UU_1$.

The offset values $\Delta_L$ and $\Delta_U$ can be predetermined fixed values, or they can be established as a function of the minimum and maximum observed values L and U or other statistics of the observed operating condition 34.

The offset values preferably are slightly greater than the likely deviation of the observed operating condition 34 from one cleaning cycle to the next. In the illustrated example in which the observed operating condition is the RF power supply frequency F, the range of RF power supply frequencies typically shifts by 3 KHz from one cleaning cycle to the next, possibly because of the gradual degradation of components that are not replaced at every chamber cleaning. In that case, a suitable value for the predetermined lower and upper frequency offsets is 5 KHz.

6. Lower and Upper Limits LL and UU Based on Multiple Cleaning Cycles

As stated in the "Summary of the Invention" section, a more general expression of Step 141 is that the lower and upper limits LL and UU are based on the range of values exhibited by the operating condition 34 during "a number" of immediately preceding cleaning cycles of the plasma chamber. More specifically, the lower limit $LL_i$ is established as the minimum observed value L of the operating condition 34 during "said number" of immediately preceding cleaning cycles minus the first offset value. Likewise, the upper limit $UU_i$ is established as the maximum observed value U the operating condition 34 during "said number" of immediately preceding cleaning cycles plus the second offset value. For each workpiece processed during the i-th cleaning cycle, the limit controller will detect a malfunction in the plasma chamber if the operating condition 34 (e.g., RF power supply frequency F) is less than $LL_i$ or greater than $UU_i$ when processing of each workpiece begins (Step 104).

For example, consider an implementation of Step 141 in which "said number" is two. In other words, the lower and upper limits LL and UU are based on the range of values exhibited by the operating condition 34 during the two immediately preceding cleaning cycles. In this implementation of Step 141, the limit controller sets the lower limit $LL_i$ equal to either $L_{(i-1)}$ or $L_{(i-2)}$, whichever is smaller, minus $\Delta_L$. It sets the upper limit $UU_i$ equal to either $U_{(i-1)}$ or $U_{(i-2)}$, whichever is greater, plus $\Delta_U$.

More generally, let "said number" be denoted by the symbol N. In other words, in Step 141 the limit controller sets the lower limit $LL_i$ to the lowest observed value L of the operating condition 34 during N immediately preceding cleaning cycles, minus the offset value $\Delta_L$. The limit controller sets the upper limit $UU_i$ to the highest observed value U of the operating condition 34 during processing of workpieces during the N immediately preceding cleaning cycles, plus the offset value $\Delta_U$.

The preceding paragraph can be expressed mathematically as follows:

$$LL_i = \text{Min}(L_{i-N}, \ldots, L_{i-2}, L_{i-1}) - \Delta_L$$

$$UU_i = \text{Max}(U_{i-N}, \ldots, U_{i-2}, U_{i-1}) + \Delta_U$$

7. Observing a Specific One of Multiple Process Steps for Each Workpiece

If each workpiece undergoes a succession of two or more process steps within the plasma chamber, the observed operating condition 34 may be an operating condition of the plasma chamber during a specific process step other than the first process step. In that case, in each of the methods described above, each reference to the beginning, the end or the performing of the processing of the workpiece should be interpreted to mean the beginning, the end, or the performing, respectively, of that specific process step.

Preferably, the limit controller 40 is a conventional programmable computer that provides a user interface that permits a person to select one of several possible operating conditions of the plasma chamber to be the observed operating condition 34, and to select one of the process steps to be the specific process step in which the selected operating condition is observed.

Specifically, Step 101 in this case means to wait until the specified process step begins for the next workpiece. Step 120 is performed throughout the specified process step until the specified process step ends (Step 130).

8. Observing Multiple Operating Conditions or Multiple Process Steps

The invention also can observe multiple operating conditions, multiple process steps, or both to detect a malfunction in the plasma chamber. Preferably, the limit controller 40 is a conventional programmable computer that provides a user interface that permits a person to select any number of several possible operating conditions of the plasma chamber to be the observed operating condition 34, and to select any number of the process steps to be the specific process step in which the selected operating condition is observed.

When more than one operating condition is to be observed, the entire process for detecting malfunction, as described above and as shown in FIGS. 5 and 6, can be replicated and performed in parallel for each operating condition. The limit controller would determine (and store in memory 46) separate values for the minimum and maximum observed values L and U for each operating condition being observed, and it would determine (and store in memory 46) separate lower and upper limits LL and UU for each operating condition being observed.

Similarly, the user preferably could selected that the same or different operating condition should be observed during two or more different process steps in cases in which a plurality of successive process steps are performed on a workpiece in the plasma chamber. In that case, the limit controller would treat the operating condition observed during each distinct process step as a different operating condition as described in the preceding paragraph, regardless of whether the operating condition observed in two different process steps happened to be the same physical parameter.

9. Other Modifications

In the embodiments described above, the comparator circuit 44 performs Step 104—testing whether the operating condition 34 is below the lower limit LL or above the upper limit UU—only once for each workpiece that is processed in the plasma chamber. Optionally, the comparator circuit can repeat Step 104 periodically during processing of each workpiece.

However, performing Step 104 periodically is unnecessary to detect the type of malfunction that the present invention is especially adapted to detect, namely, a malfunction that occurs prior to, or upon the initiation of, processing of a workpiece. Such periodic comparisons are especially unnecessary if the limit controller, in addition to performing the malfunction detection method of the present invention, also performs the first prior art malfunction detection method of FIG. 4 of US patent application publication no. 2008-0074255 A1, as described above in the section "2. Overview of Detecting Malfunction in Plasma Chamber". It is preferable to perform both the first prior art malfunction detection method and the malfunction detection of the present invention in order to detect both the first and second types of malfunctions described in that section.

The invention claimed is:

1. A method of detecting malfunction of an RF-powered plasma chamber, comprising repeatedly performing the steps of:
   plasma processing a set of one or more workpieces within the plasma chamber;
   a controller observing the minimum value and the maximum value of a first operating condition of the plasma chamber during the plasma processing of said set;
   the controller establishing the value of a first lower limit as equal to said minimum value of the first operating condition minus a first non-negative offset value, and establishing the value of a first upper limit as equal to said maximum value of the first operating condition plus a second non-negative offset value;
   after the step of plasma processing said set, cleaning one or more components of the plasma chamber;
   subsequently plasma processing a subsequent set of one or more workpieces within the plasma chamber; and
   for each respective workpiece in said subsequent set, the controller performing the steps of:
      (i) after plasma processing of that respective workpiece begins, observing the present value of said first operating condition of the plasma chamber;
      (ii) comparing said present value of the first operating condition to the values established in the establishing step for the first lower limit and the first upper limit; and
      (iii) signaling an alert if said present value of the first operating condition is less than the first lower limit or greater than the first upper limit.

2. The method of claim 1, wherein the first operating condition is one of: RF power supply frequency, DC bias voltage on an electrode of the plasma chamber, or RF voltage on an electrode of the plasma chamber.

3. The method of claim 1, wherein the first operating condition is an operating condition of the plasma chamber whose value changes in response to a change in one or more physical properties of the plasma within the plasma chamber.

4. The method of claim 1, further comprising the preceding step of:
   cleaning one or more components of the plasma chamber.

5. The method of claim 1, further comprising the step of:
   preceding the step of observing the present value, delaying for a predetermined settling time period after said plasma processing of said respective workpiece begins.

6. The method of claim 1, further comprising the steps of:
   the controller observing a minimum value and a maximum value of a second operating condition of the plasma chamber during said plasma processing of the workpieces of said set;
   the controller establishing the value of a second lower limit as equal to said minimum value of the second operating condition minus a third non-negative offset value, and establishing the value of a second upper limit as equal to said maximum value of the second operating condition plus a fourth non-negative offset value; and
   for each respective workpiece in said subsequent set, the controller performing the steps of:
      (i) after the plasma processing of that respective workpiece begins, observing the present value of said second operating condition of the plasma chamber;
      (ii) comparing said present value of said second operating condition to the second lower limit and the second upper limit; and
      (iii) signaling an alert if said present value of said second operating condition is less than the second lower limit or greater than the second upper limit.

7. A method of detecting malfunction of an RF-powered plasma chamber, comprising repeatedly performing the steps of:
   performing first and second plasma processes on each successive workpiece in a set of one or more workpieces;
   a controller observing the minimum value and the maximum value of a first operating condition of the plasma chamber during said performing of the first plasma process on the workpieces of said set;
   the controller establishing the value of a first lower limit as equal to said minimum value minus a first non-negative offset value, and establishing the value of a first upper limit as equal to said maximum value plus a second non-negative offset value;
   after performing said first and second plasma processes on each successive workpiece in said set, cleaning one or more components of the plasma chamber;
   subsequently performing said first and second plasma processes on a subsequent set of one or more workpieces within the plasma chamber; and
   for each respective workpiece in said subsequent set, the controller performing the steps of:
      (i) after the performing of the first plasma process on that respective workpiece begins, observing the present value of said first operating condition of the plasma chamber;
      (ii) comparing said present value to the values established in the establishing step for the lower limit and upper limit; and
      (iii) signaling an alert if said present value is less than the lower limit or greater than the upper limit.

8. The method of claim 7, wherein the second plasma process is characterized by at least one operating condition of the plasma chamber that is different from the first plasma process.

9. The method of claim 7, further comprising the steps of:
   the controller observing a minimum value and a maximum value of a second operating condition of the plasma chamber during said performing of the second plasma process on the workpieces of said set;
   the controller establishing the value of a second lower limit as equal to said minimum value of the second operating condition minus a third non-negative offset value, and establishing the value of a second upper limit as equal to said maximum value of the second operating condition plus a fourth non-negative offset value; and for each respective workpiece in said subsequent set, the controller performing the steps of:
(i) after the performing of the second plasma process on that respective workpiece begins, observing the present value of said second operating condition of the plasma chamber;
(ii) comparing said present value of the second operating condition to the second lower limit and the second upper limit; and
(iii) signaling an alert if said present value of the second operating condition is less than the second lower limit or greater than the second upper limit.

10. The method of claim 9, wherein the second plasma process is characterized by at least one operating condition of the plasma chamber that is different from the first plasma process.

11. Apparatus for detecting malfunction of an RF-powered plasma chamber, comprising:
a limit controller that includes a comparator and a memory circuit;
wherein:
during plasma processing within the plasma chamber of a first set of one or more workpieces, the limit controller observes the minimum value and the maximum value of an operating condition of the plasma chamber;
the limit controller stores in the memory circuit the value of a lower limit equal to said minimum value minus a first non-negative offset value;
the limit controller stores in the memory circuit the value of an upper limit equal to said maximum value plus a second non-negative offset value;
during plasma processing within the plasma chamber of a subsequent set of one or more workpieces, the limit controller observes the present value of said operating condition of the plasma chamber after plasma processing begins for each workpiece of the subsequent set;
during the plasma processing within the plasma chamber of a subsequent set of one or more workpieces, for each respective workpiece in said subsequent set:
(i) after plasma processing of that respective workpiece begins, the limit controller observes the present value of said operating condition of the plasma chamber,
(ii) the comparator compares said present value to the values stored in the memory circuit for the lower limit and upper limit, and
(iii) the limit controller signals an alert if said present value is less than the lower limit or greater than the upper limit;
said plasma processing of said subsequent set of one or more workpieces is subsequent to a cleaning of one or more components of the plasma chamber; and
said cleaning is subsequent to said plasma processing of said first set of one or more workpieces.

12. The apparatus of claim 11, wherein the operating condition is one of: RF power supply frequency, DC bias voltage on an electrode of the plasma chamber, or RF voltage on an electrode of the plasma chamber.

13. The apparatus of claim 11, wherein the operating condition is an operating condition of the plasma chamber whose value changes in response to a change in one or more physical properties of the plasma within the plasma chamber.

14. The apparatus of claim 11, wherein:
the limit controller observes said present value subsequent to a predetermined settling time period after said plasma processing of said respective workpiece begins.

15. The apparatus of claim 11, wherein:
the limit controller observes a second minimum value and a second maximum value of a second operating condition of the plasma chamber during said performing of the plasma process on the workpieces of the first set;
the limit controller establishes the value of a second lower limit as equal to said second minimum value minus a third non-negative offset value, and establishing the value of a second upper limit as equal to said second maximum value plus a fourth non-negative offset value; and
during said plasma processing within the plasma chamber of said subsequent set of one or more workpieces, the limit controller observes the present value of said second operating condition of the plasma chamber after plasma processing begins for each workpiece of the subsequent set
for each respective workpiece in said subsequent set, performing the steps of:
(i) after the performing of the plasma process on that respective workpiece begins, observing the present value of said second operating condition of the plasma chamber;
(ii) comparing said present value to the second lower limit and the second upper limit; and
(iii) signaling an alert if said present value is less than the second lower limit or greater than the second upper limit.

* * * * *